US009252255B2

(12) United States Patent
Kim et al.

(10) Patent No.: US 9,252,255 B2
(45) Date of Patent: Feb. 2, 2016

(54) HIGH ELECTRON MOBILITY TRANSISTOR AND METHOD OF MANUFACTURING THE SAME

(71) Applicant: Samsung Electronics Co., Ltd., Suwon-Si, Gyeonggi-Do (KR)

(72) Inventors: Jong-seob Kim, Seoul (KR); In-jun Hwang, Hwaseong-si (KR); Jai-kwang Shin, Anyang-si (KR); Jae-joon Oh, Seongnam-si (KR); Woo-chul Jeon, Daegu (KR); Hyuk-soon Choi, Hwaseong-si (KR); Sun-kyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 14/085,121

(22) Filed: Nov. 20, 2013

(65) Prior Publication Data

US 2014/0327043 A1    Nov. 6, 2014

(30) Foreign Application Priority Data

May 1, 2013    (KR) .......................... 10-2013-0049058

(51) Int. Cl.
*H01L 29/66* (2006.01)
*H01L 29/778* (2006.01)
*H01L 29/10* (2006.01)
*H01L 29/417* (2006.01)
(Continued)

(52) U.S. Cl.
CPC ........ *H01L 29/7787* (2013.01); *H01L 29/1066* (2013.01); *H01L 29/66462* (2013.01); *H01L 29/0619* (2013.01); *H01L 29/2003* (2013.01); *H01L 29/41725* (2013.01); *H01L 29/41766* (2013.01)

(58) Field of Classification Search
CPC ..................... H01L 29/41766; H01L 29/0619; H01L 29/2003; H01L 29/7787; H01L 29/66462; H01L 29/1066
USPC ........... 257/194, E29.246, E29.247, E29.248, 257/E21.403
See application file for complete search history.

(56) References Cited

U.S. PATENT DOCUMENTS 5,250,822 A  * 10/1993  Sonoda et al. ................ 257/194
7,622,763 B2    11/2009  Suda et al.
(Continued)

FOREIGN PATENT DOCUMENTS

JP    2009-111217 A    5/2009
KR    2004-0018502 A    3/2004
(Continued)

*Primary Examiner* — Tan N Tran
(74) *Attorney, Agent, or Firm* — Harness, Dickey & Pierce, P.L.C.

(57) ABSTRACT

Provided are a high electron mobility transistor (HEMT) and a method of manufacturing the HEMT. The HEMT includes: a channel layer comprising a first semiconductor material; a channel supply layer comprising a second semiconductor material and generating two-dimensional electron gas (2DEG) in the channel layer; a source electrode and a drain electrode separated from each other in the channel supply layer; at least one depletion forming unit that is formed on the channel supply layer and forms a depletion region in the 2DEG; at least one gate electrode that is formed on the at least one depletion forming unit; at least one bridge that connects the at least one depletion forming unit and the source electrode; and a contact portion that extends from the at least one bridge under the source electrode.

17 Claims, 16 Drawing Sheets

(51) Int. Cl.
*H01L 29/06* (2006.01)
*H01L 29/20* (2006.01)

(56) References Cited

U.S. PATENT DOCUMENTS

| | | |
|---|---|---|
| 7,723,752 B2 | 5/2010 | Yoshida et al. |
| 7,816,707 B2 | 10/2010 | Hikita et al. |
| 2001/0032997 A1 | 10/2001 | Forbes et al. |
| 2006/0273347 A1 | 12/2006 | Hikita et al. |
| 2008/0315256 A1 | 12/2008 | Ohta et al. |
| 2011/0018002 A1 | 1/2011 | Chen et al. |
| 2011/0108885 A1 | 5/2011 | Sazawa et al. |
| 2011/0156053 A1* | 6/2011 | Malhan et al. ............ 257/77 |
| 2011/0260777 A1* | 10/2011 | Suzuki et al. ............ 327/493 |
| 2011/0297961 A1 | 12/2011 | Bunin et al. |
| 2012/0256233 A1 | 10/2012 | Cui et al. |
| 2012/0280278 A1 | 11/2012 | Curatola et al. |
| 2013/0140578 A1 | 6/2013 | Yu et al. |
| 2013/0141156 A1* | 6/2013 | Teo et al. ............ 327/530 |
| 2014/0103969 A1 | 4/2014 | Jeon et al. |

FOREIGN PATENT DOCUMENTS

| | | |
|---|---|---|
| KR | 2007-0012852 A | 1/2007 |
| KR | 10-0860070 B1 | 9/2008 |
| KR | 2010-0138871 A | 12/2010 |
| KR | 10-1008272 B1 | 1/2011 |
| KR | 20110041550 A | 4/2011 |
| KR | 20110058332 A | 6/2011 |
| WO | WO-2010/014126 A2 | 2/2010 |

* cited by examiner

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2013-0049058, filed on May 1, 2013, in the Korean Intellectual Property Office, the disclosure of which is incorporated herein in its entirety by reference.

BACKGROUND

1. Field

The present disclosure relates to semiconductor devices and/or methods of manufacturing the same, and more particularly, to high electron mobility transistors (HEMTs) and/or methods of manufacturing the same.

2. Description of the Related Art

A nitride semiconductor device may be used, for example, as a power device used in power control. In a power converting system, the efficiency of the power device may decide the entire system efficiency. An example of the power device is a metal oxide semiconductor field effect transistor (MOSFET) or an insulated gate bipolar transistor (IGBT), which is based on silicon. However, due to the limitations in the properties of silicon and the manufacturing processes therefor, it is difficult to increase the efficiency of a silicon-based power device. Another example of the power device is a power device using a III-V compound semiconductor. An example of this power device is a high electron mobility transistor (HEMT), which uses a heterojunction structure of a compound semiconductor.

A HEMT includes semiconductor layers having different electric polarization characteristics. A semiconductor layer having a relatively large polarizability may induce two-dimensional electron gas (2DEG) in another semiconductor layer bonded to the semiconductor layer. The 2DEG is used as a channel, and thus, the HEMT may have a high electron mobility. Also, the HEMT includes a compound semiconductor having a wide band gap. Thus, a breakdown voltage of the HEMT may be higher than that of a typical transistor. The breakdown voltage of the HEMT may increase proportionally to a thickness of a compound semiconductor layer including 2DEG, such as a GaN layer.

SUMMARY

Provided are high electron mobility transistors (HEMTs) having normally-off characteristics and/or a reduced dispersion of a threshold voltage.

Provided are methods of manufacturing the HEMTs having normally-off characteristics and/or a reduced dispersion of a threshold voltage.

Additional aspects will be set forth in part in the description which follows and, in part, will be apparent from the description, or may be learned by practice of example embodiments.

According to an example embodiment, a high electron mobility transistor (HEMT) includes: a channel supply layer on a channel layer, the channel layer including a first semiconductor material, the channel supply layer including a second semiconductor material, and the channel supply layer configured to generate a two-dimensional electron gas (2DEG) in the channel layer; a source electrode and a drain electrode separated from each other and connected to the channel supply layer; a depletion forming unit on the channel supply layer, the depletion forming unit configured to form a depletion region in the 2DEG; a gate electrode on the depletion forming unit; a bridge that connects the source electrode to the depletion forming unit; and a contact portion that extends from the bridge to under the source electrode.

In some example embodiments, a width of the contact portion may be the same or different than a width of the bridge.

In some example embodiments, the HEMT may include a plurality of bridges, the plurality of bridges may include a first bridge and a second bridge between the depletion forming unit and the source electrode; the HEMT may include a plurality of contact portions, the plurality of contact portions may include a first contact portion and a second contact portion, the first contact portion may extend from an end portion of the first bridge to under the source electrode, the second contact portion may extends from an end portion of the second bridge to under the source electrode, and the first contact portion and the first bridge may be the contact portion and the bridge of the contact portion that extends from the bridge to under the source electrode.

In some example embodiments, the HEMT may include a plurality of depletion forming units on the channel supply layer and a plurality of gate electrodes. The plurality of depletion forming units may include a first depletion forming unit and a second depletion forming unit that are separated from each other, and the plurality of gate electrodes may include a first gate electrode on the first depletion forming unit and a second gate electrode on the second depletion forming unit. The second gate electrode and the second depletion forming unit may be the gate electrode and the depletion forming unit of the gate electrode on the depletion forming unit.

In some example embodiments, the HEMT may include a plurality of bridges on the channel supplying layer and a plurality of contact portions. The plurality of bridges may include a first bridge, a second bridge and a third bridge. The plurality of contact portions may include a first contact portion and a second contact portion. The second contact portion and the second bridge may be the contact portion and the bridge of the contact portion that extends from the bridge to under the source electrode. The third bridge may connect the first depletion forming unit to the second depletion forming unit. The first bridge may connect the second depletion forming unit to the source electrode. The first contact portion may extend from the first bridge to under the source electrode.

In some example embodiments, the second gate electrode may be a floating electrode. The first gate electrode may be configured to induce a second gate voltage in the second gate electrode if a first gate voltage is applied to the first gate electrode.

In some example embodiments, the second gate voltage may be determined by the first gate voltage applied to the first gate electrode, an interval between the first gate electrode and the second gate electrode, and an interval between the second gate electrode and the source electrode.

In some example embodiments, the HEMT may further include a thin film formed between the source electrode and the contact portion.

In some example embodiments, the bridge may be in the form of a strip.

In some example embodiments, the first semiconductor material may be a GaN-based material.

In some example embodiments, the first semiconductor material may include GaN, InGaN or AlGaN and the first semiconductor material may be undoped or doped with an n-type material.

In some example embodiments, the second semiconductor material may include a nitride including at least one of Al, Ga, and In.

In some example embodiments, the second semiconductor material may include at least one of GaN, AlGaN, AlInN, and AlInGaN.

In some example embodiments, the second semiconductor material may be doped with an n-type material.

In some example embodiments, the channel supply layer may include a plurality of layers according to an Al content or an In content.

In some example embodiments, the HEMT may further include a buffer layer, the channel layer may be on the buffer layer, and the buffer layer may include at least one of a GaN layer, an AlGaN layer, an Aln layer, and an InN layer.

In some example embodiments, the depletion forming unit may include a p-type semiconductor material.

In some example embodiments, the depletion forming unit may include a III-V nitride semiconductor material.

In some example embodiments, the depletion forming unit may be one of a p-type GaN and a p-type AlGaN.

In some example embodiments, a single body may include the depletion forming unit, the bridge, and the contact portion.

In some embodiments, a passivation layer may be on the channel supply layer.

In some example embodiments, the passivation layer may be one of GaN, AlGaN, AlN, InN, InGaN, and InAlGaN, and the passivation layer may be one of undoped and doped with a p-type material.

According to another example embodiment, a method of manufacturing a high electron mobility transistor (HEMT) includes: forming a channel layer and a channel supply layer stacked together; forming a first layer on the channel supply layer; forming a depletion unit on the channel supply layer by patterning and etching the first layer, the depletion unit including a depletion forming unit, a bridge extending from a side of the depletion forming unit, and a contact portion; forming a second layer on the depletion unit; forming a gate electrode on the depletion forming unit by etching the second layer; forming a source electrode on the contact portion, the source electrode spaced apart from a first side of the gate electrode; and forming a drain electrode connected to the channel supply layer, the drain electrode spaced apart from at a second side of the gate electrode.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
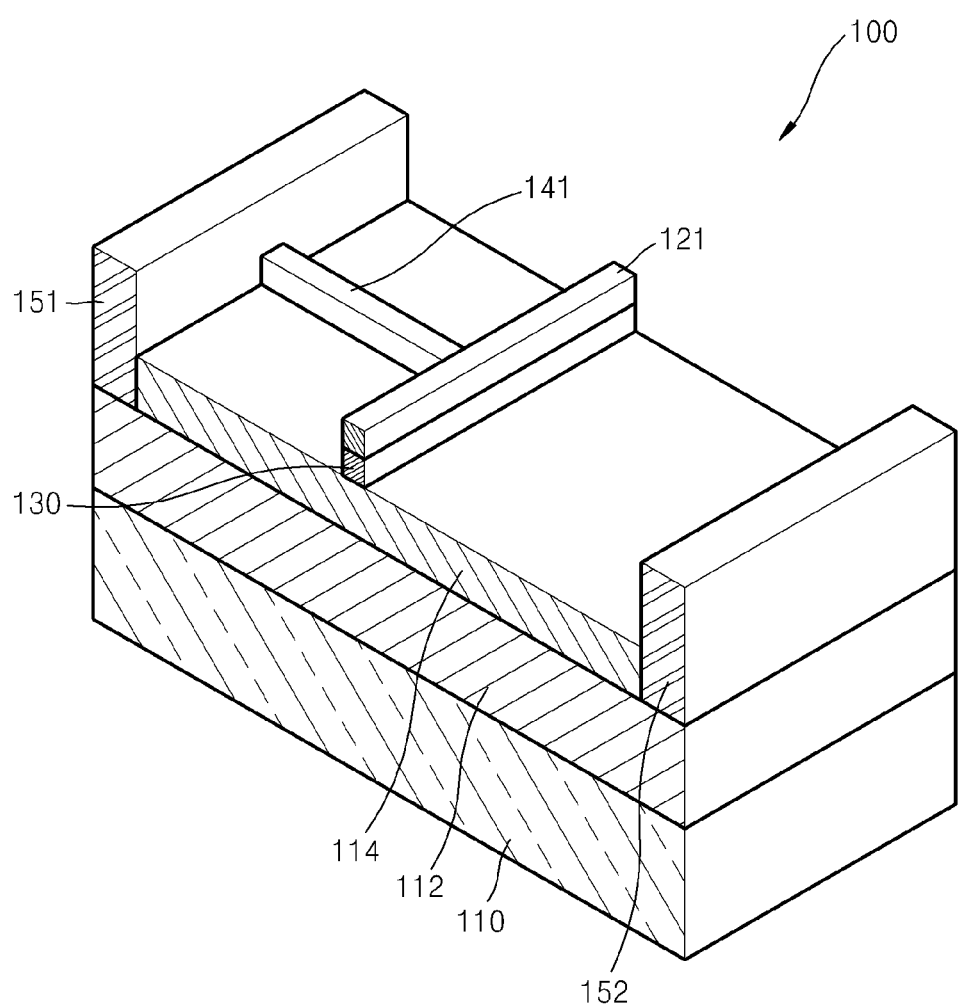
FIG. 1 is a schematic perspective view illustrating a high electron mobility transistor (HEMT) according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
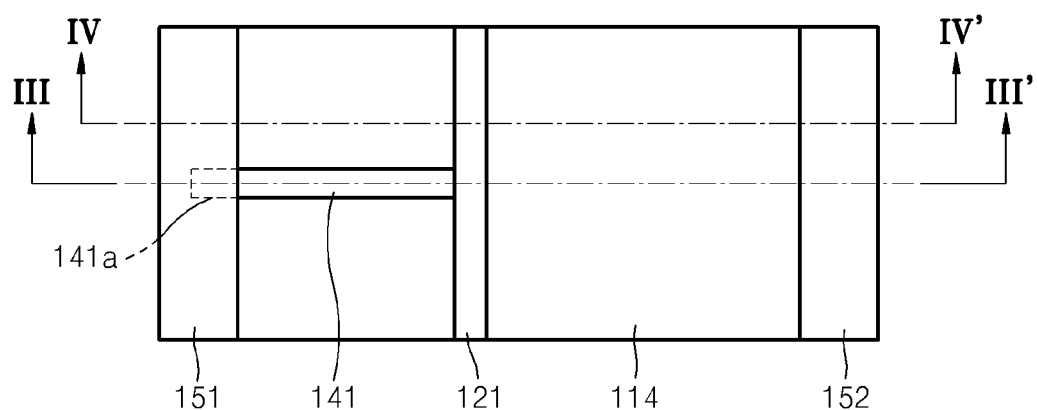
FIG. 2 is a plan view illustrating the HEMT illustrated in FIG. 1 according to an example embodiment.
Figure 3:
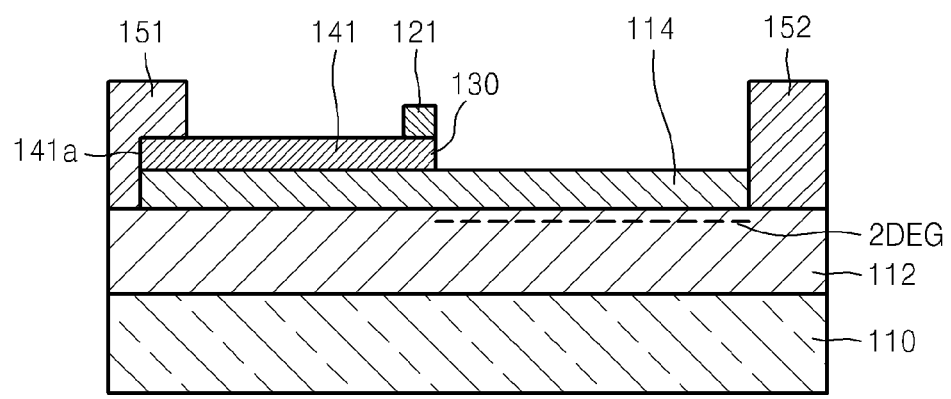
FIG. 3 is a cross-sectional view illustrating the HEMT of FIG. 2 cut along line III-III' according to an example embodiment.
Figure 4:
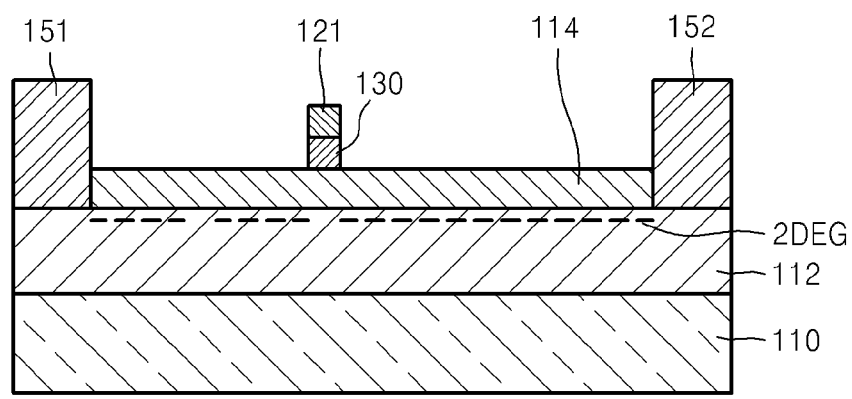
FIG. 4 is a cross-sectional view illustrating the HEMT of FIG. 2 cut along line IV-IV' according to an example embodiment.

FIG. 1 is a schematic perspective view illustrating a high electron mobility transistor (HEMT) 100 according to an example embodiment. FIG. 2 is a plan view illustrating the HEMT 100 illustrated in FIG. 1. FIG. 3 is a cross-sectional view illustrating the HEMT 100 cut along line III-III' of FIG. 2 cut along line. FIG. 4 is a cross-sectional view illustrating the HEMT 100 cut along line IV-IV' of FIG. 2.

Referring to FIGS. 1 through 4, the HEMT 100 includes a channel layer 112 and a channel supply layer 114 on the channel layer 112. A substrate 110 may be disposed under the channel layer 112. The substrate 110 may include, for example, sapphire, Si, SiC, or GaN. However, the substrate 110 is not limited thereto, and it may also be formed of other materials. The channel layer 112 may include a first semiconductor material. The first semiconductor may be a III-V compound semiconductor, but is not limited thereto. For example, the channel layer 112 may be a GaN-based material layer. For example, the channel layer 112 may be a GaN layer, an InGaN layer, or an AlGaN layer. The channel layer 112 may be undoped or may be doped with an n-type material. However, the channel layer 112 is not limited thereto and may be formed of any material layer from which two-dimensional electron gas (2DEG) may be generated, and the material layer may be different from a semiconductor layer. In the channel layer 112, a 2DEG layer may be formed by, for example, spontaneous polarization ($P_{SP}$) and piezo-polarization ($P_{PE}$) due to tensile strain.

For example, the channel layer 112 may be a GaN layer. In this case, the channel layer 112 may be an undoped GaN layer, and may also be a GaN layer doped with desired (and/or alternatively predetermined) impurities according to circumstances. A GaN-based semiconductor may have excellent properties, such as a large energy band gap, high thermal and chemical stability, and high electron saturation speed (~3× $10^7$ cm/sec), and thus, it may be used not only in an optical device but also in a high-frequency and high-output electronic device. An electronic device using a GaN-based semiconductor may have various characteristics, such as a high breakdown field effect (~3×$10^6$ V/cm), a high maximum current density, stable high-temperature operating characteristics, and a high thermal conductivity. In the case of a HEMT that uses a GaN-based hetero-junction structure, band-discontinuity between a channel layer and a channel supply layer is relatively large so that electrons may be concentrated at a bonding interface at a high density, thus, increasing electron mobility.

The channel supply layer 114 may cause 2DEG to be generated in the channel layer 112. The 2DEG may be formed in a portion of the channel layer 112 that is below an interface between the channel layer 112 and the channel supply layer 114. The channel supply layer 114 may include a second semiconductor material that is different from the first semiconductor material of the channel layer 112. The second semiconductor material may be different from the first semiconductor material in terms of at least one of polarizability, energy band gap, and lattice constant. For example, at least one of polarizability and energy band gap of the second semiconductor material may be greater than a corresponding property of the first semiconductor material.

The channel supply layer 114 may include a nitride including at least one of, for example, Al, Ga, and In, and may have a single layer structure or a multi-layer structure. For example, the channel supply layer 114 may be at least one of an AlN layer, an AlGaN layer, an AlInN layer, an AlGaInN layer, and a combination of these. However, the channel supply layer 114 is not limited thereto. The channel supply layer 114 may be an undoped layer or may also be a layer doped with desired (and/or alternatively predetermined) impurities. A thickness of the channel supply layer 114 may be, for example, several tens of nm or less. For example, the channel supply layer 114 may have a thickness of about 50 nm or less, but is not limited thereto.

Figure 5:
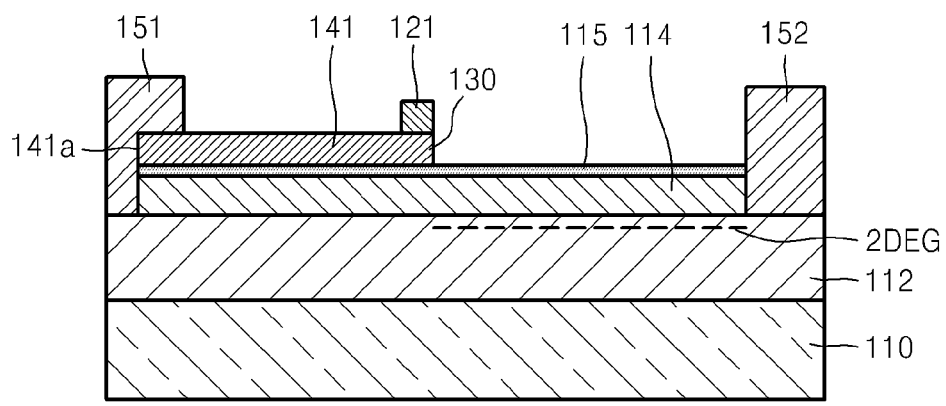
FIG. 5 illustrates the HEMT illustrated in FIG. 1 in which a passivation layer is further formed, according to an example embodiment.

As illustrated in FIG. 5, a passivation layer 115 may be further formed on the channel supply layer 114. The passivation layer 115 may be formed of a nitride including at least one of Al, Ga, and In. For example, the passivation layer 115 may be formed of GaN, AlGaN, AlN, InN, InGaN, and InAlGaN. The passivation layer 115 may be undoped or may be doped with a p-type material. The passivation layer 115 may reduce or prevent damage to the channel layer 112 and the channel supply layer 114 in a process in which the channel layer 112 and the channel supply layer 114 are stacked. The passivation layer 115 may have a thickness of about 30 nm or less, but it is not limited thereto. The passivation layer 115 may be completely removed during manufacturing a semiconductor device, or a portion thereof may be left.

A source electrode 151 and a drain electrode 152 may be formed on the channel layer 112 at both sides of the channel supply layer 114. The source electrode 151 and the drain electrode 152 may be electrically connected to the 2DEG. The 2DEG formed in the channel layer 112 may be used as a current path (channel) between the source electrode 151 and the drain electrode 152. The source electrode 151 and the drain electrode 152 may be formed on the channel supply layer 114 or may be formed in the channel supply layer 114 or the channel layer 112 up to an intermediate depth. Alternatively, the arrangement of the source electrode 151 and the drain electrode 152 may be modified in various manners.

At least one depletion forming unit 130 may be formed on a portion of the channel supply layer 114 between the source electrode 151 and the drain electrode 152. For example, at least one depletion forming unit 130 may be formed on a portion of the channel supply layer 114 between the gate electrode 121 and the source electrode 151, but example embodiments are not limited thereto. The depletion forming unit 130 may perform the function of forming a depletion region in the 2DEG. Due to the depletion forming unit 130, a conduction band energy and a valence band energy of a portion of the channel supply layer 114 disposed below may be increased, and as a result, a depletion region of 2DEG may be formed in a portion of the channel layer 112 corresponding to the depletion forming unit 130. Accordingly, in a portion of the channel layer 112 corresponding to the depletion forming unit 130, 2DEG may be removed or an amount thereof may be reduced. Alternatively, the portion of the channel layer 112 corresponding to the depletion forming unit 130 may have different characteristics from the other portion of the channel layer 112 (e.g., electron density). A portion where the 2DEG is removed may be referred to as a 'cut-off region', and the HEMT 100 may have normally-off characteristics due to this cut-off region.

The depletion forming unit 130 may include a p-type semiconductor material. That is, the depletion forming unit 130 may be a semiconductor layer doped with a p-type impurity. Also, the depletion forming unit 130 may include a III-V group nitride semiconductor. For example, the depletion forming unit 130 may include at least one of GaN, AlGaN, InN, AlInN, InGaN, and AlInGaN, and may be doped with a p-type impurity, such as Mg. For example, the depletion forming unit 130 may be a p-GaN layer or a p-AlGaN layer. Due to the depletion forming unit 130, a conduction band energy and a valence band energy of a portion of the channel supply layer 114 below may increase so as to form a cut-off region of 2DEG.

The depletion forming unit 130 may be, for example, in the form of a strip. A depletion forming unit 130 or a plurality of depletion forming units 130 may be formed between the source electrode 151 and the drain electrode 152, and at least one gate electrode 121 may be formed on the depletion forming unit 130. A gate electrode 121 or a plurality of gate electrodes 121 may be formed to correspond to the number of the depletion forming unit 130. In FIG. 1, one depletion forming unit 130 and one gate electrode 121 are included.

The gate electrode 121 may include various metal materials or metal compounds. The gate electrode 121 may have the same width as that of the depletion forming unit 130. However, the gate electrode 121 is not limited thereto, and the gate electrode 121 may have a different width from that of the depletion forming unit 130.

At least one bridge 141 connecting the depletion forming unit 130 and the source electrode 151 may be formed between the depletion forming unit 130 and the source electrode 151. The bridge 141 may be formed of the same material as the depletion forming unit 130. The bridge 141 may include, for example, a p-type semiconductor material. The bridge 141 may include a III-V nitride semiconductor. For example, the bridge 141 may include at least one of GaN, AlGaN, InN, AlInN, InGaN, and AlInGaN, and may be doped with a p-type impurity, such as Mg. For example, the bridge 141 may be a p-GaN layer of a p-AlGaN layer.

Referring to FIG. 2, a contact portion 141a extending from the bridge 141 under the source electrode 151 may be formed. The contact portion 141a may be in the source electrode 151. The contact portion 141a may be formed of the same material as the bridge 141. The contact portion 141a may include, for example, a p-type semiconductor material. The bridge 141 may include a III-V nitride semiconductor. For example, the bridge 141 may include at least one of GaN, AlGaN, InN, AlInN, InGaN, and AlInGaN, and may be doped with a p-type impurity, such as Mg. For example, the bridge 141 may be a p-GaN layer of a p-AlGaN layer.

The contact portion 141a may have the same width as the bridge 141. However, the contact portion 141a is not limited thereto and may have various widths and shapes. The contact portion 141a may have an increased contact surface with respect to the source electrode 151 to reduce a dispersion in a threshold voltage.

The depletion forming unit 130, the bridge 141, and the contact portion 141a may be formed as a single body. In this case, the depletion forming unit 130, the bridge 141, and the contact portion 141a may have the same height.

However, example embodiments are not limited thereto, and the depletion forming unit 130 and the bridge 141 may have the same height or different heights. The bridge 141 and the contact portion 141b may have the same height or different heights.

Figure 6:
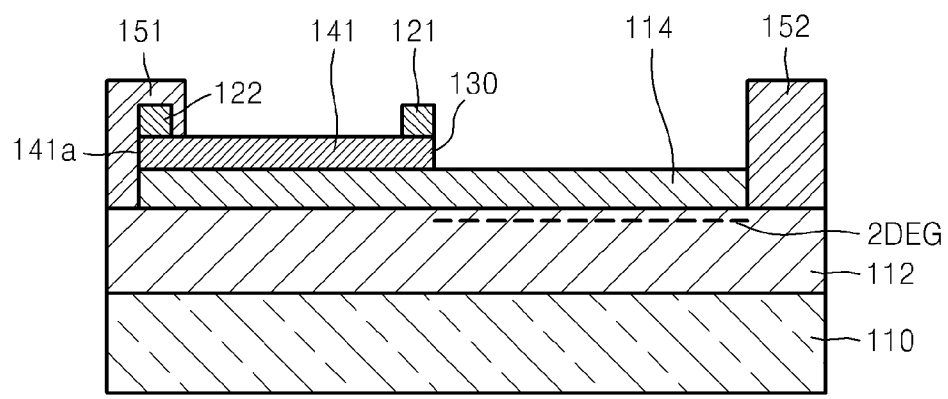
FIG. 6 illustrates the HEMT illustrated in FIG. 1 in which a gate electrode is further formed under a source electrode, according to an example embodiment.

As illustrated in FIG. 6, a contact resistance portion 122 may be further disposed under or inside the source electrode 151. The contact resistance portion 122 may be formed on the contact portion 141a. The contact resistance portion 122 may increase contact resistance.

Figure 7:
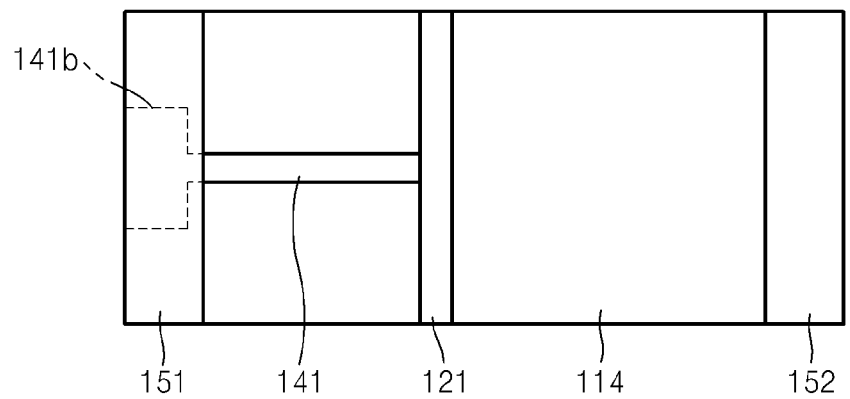
FIG. 7 illustrates a contact portion of the HEMT illustrated in FIG. 1 according to another example embodiment.

While the contact portion 141a has the same width as that of the bridge 141 in FIG. 2, as illustrated in FIG. 7, a contact portion 141b may have a greater width than that of the bridge 141. Also, the shape or size of the contact portion 141b may be modified in various manners. For example, the contact portion 141b may be formed to vertically extend under the source electrode 151 (a vertical direction in FIG. 7).

Figure 8:
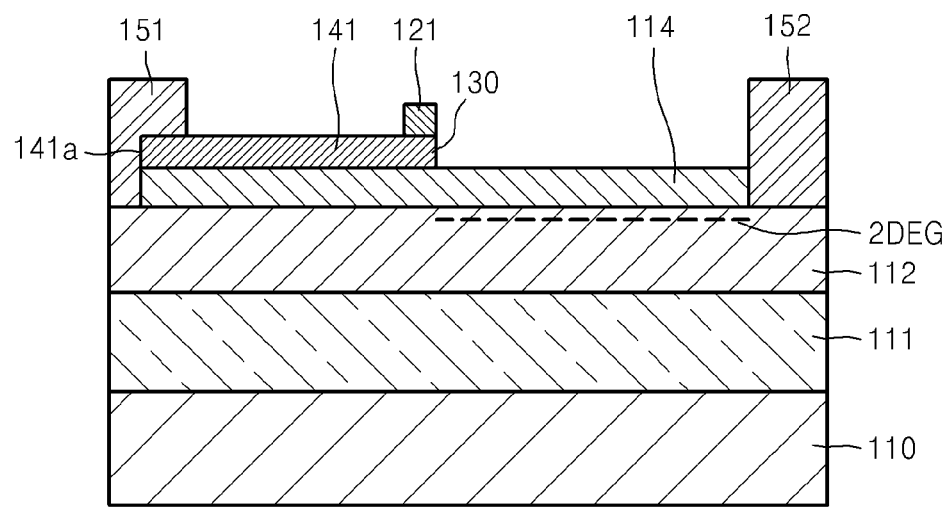
FIG. 8 illustrates the HEMT illustrated in FIG. 1 in which a buffer layer is further formed, according to an example embodiment.

As illustrated in FIG. 8, a buffer layer 111 may be further formed between the channel layer 112 and the substrate 110. The buffer layer 111 may be formed to mitigate differences in lattice constants and coefficients of thermal expansion of the substrate 110 and the channel layer 112 to thereby reduce crystallinity of the channel layer 112. The buffer layer 111 may be formed of, for example, AlN, GaN, AlGaN, AlInN, or AlGaInN. The buffer layer 111 may include a single layer or a plurality of layers. For example, when the buffer layer 111 includes aluminum (Al), an Al content (atom %) may be 0% to about 70%. According to circumstances, a seed layer (not shown) may be further formed between the substrate 110 and the buffer layer 111. The seed layer may be a base layer for growing the buffer layer 111. The substrate 110 and the buffer layer 111 may be removed during or after the manufacture of a HEMT. In other words, the substrate 110 and the buffer layer 111 may be selectively included in a HEMT.

Figure 9:
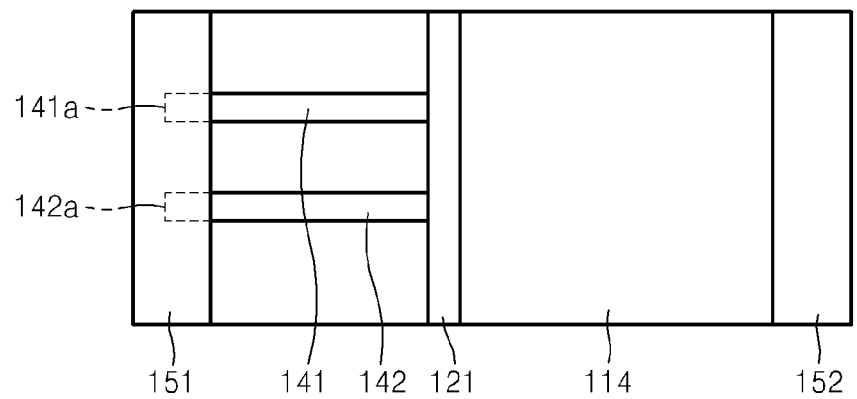
FIG. 9 illustrates the HEMT illustrated in FIG. 1 in which patterns of a bridge and a contact portion are modified, according to an example embodiment.

FIG. 9 illustrates a HEMT in which a plurality of bridges are formed compared to the HEMT 100 illustrated in FIG. 1, according to another example embodiment. For example, a first bridge 141 and a second bridge 142 connecting a depletion forming unit 130 and a source electrode 151 are formed, and a first contact portion 141a and a second contact portion 142a respectively extending from the first bridge 141 and the second bridge 142 under the source electrode 151 may be formed. As described above, the number and pattern of bridges and contact portions may be modified in various manners.

Figure 10:
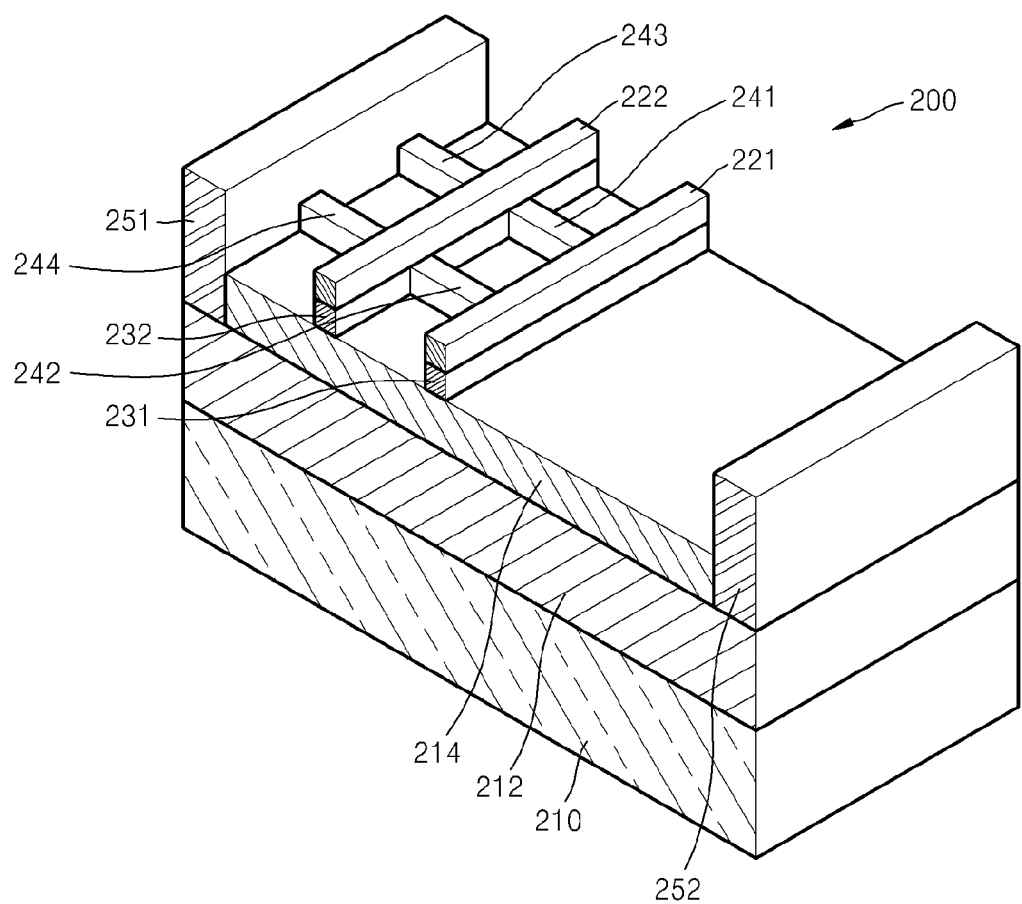
FIG. 10 is a schematic perspective view illustrating a HEMT according to another example embodiment.
Figure 11:
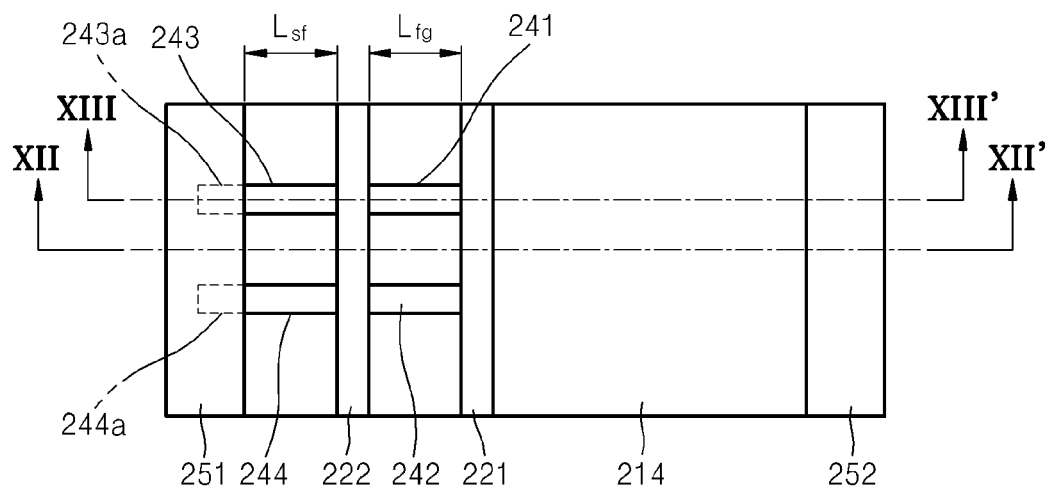
FIG. 11 is a plan view illustrating the HEMT of FIG. 10 according to an example embodiment.
Figure 12:
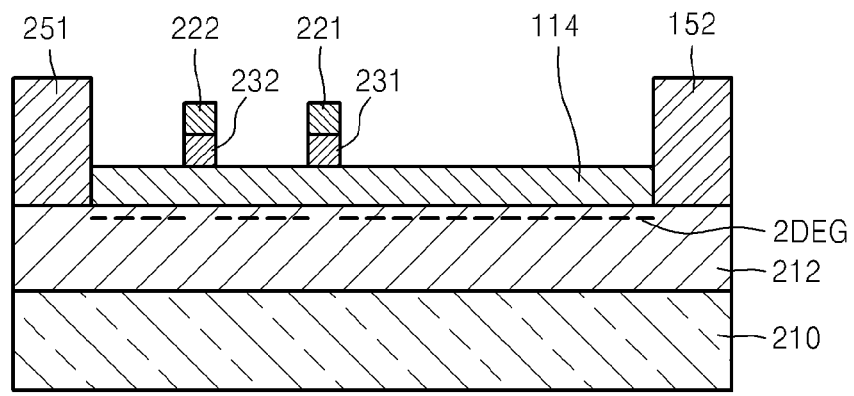
FIG. 12 is a cross-sectional view illustrating the HEMT cut along line XII-XII' of FIG. 11 according to an example embodiment.
Figure 13:
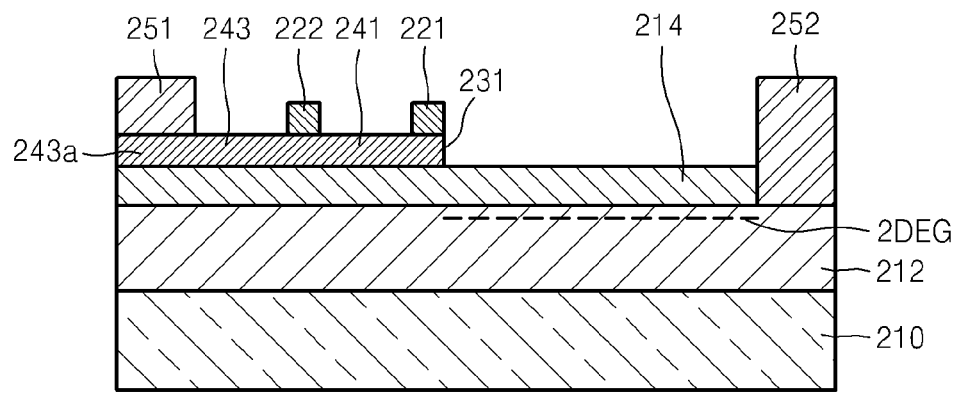
FIG. 13 is a cross-sectional view illustrating the HEMT cut along line XIII-XIII' of FIG. 11 according to an example embodiment.

FIG. 10 is a schematic perspective view illustrating a HEMT 200 according to another example embodiment. FIG. 11 is a plan view illustrating the HEMT 200 of FIG. 10. FIG. 12 is a cross-sectional view illustrating the HEMT 200 cut along line XII-XII' of FIG. 11. FIG. 13 is a cross-sectional view illustrating the HEMT 200 cut along line XIII-XIII' of FIG. 11. Hereinafter, description will focus on differences from the above-described some example embodiments.

A channel layer 212 and a channel supply layer 214 are formed on a substrate 210. A source electrode 251 and a drain electrode 252 may be formed at both sides of the channel supply layer 214. Lower surfaces of the source electrode 251 and the drain electrode 252 may contact an upper surface of the channel layer 212 or may be disposed at a lower position than the upper surface of the channel layer 212, or may contact an upper surface of the channel supply layer 214 or may be disposed at a lower position than the upper surface of the channel supply layer 214. The lower surfaces of the source electrode 251 and the drain electrode 252 may be disposed at the same height. Alternatively, the source electrode 251 and the drain electrode 252 may be disposed at different heights. The channel layer 212, the channel supply layer 214, the source electrode 251, and the drain electrode 252 are substantially the same as those corresponding elements described with reference to FIG. 1, and thus, detailed descriptions thereof are omitted.

For example, a first depletion forming unit 231 may be formed on the channel supply layer 214 between the source electrode 251 and the drain electrode 252. A second depletion forming unit 232 that is separated from the first depletion forming unit 231 may be formed between the first depletion forming unit 231 and the source electrode 251. For example, the first depletion forming unit 231 and the second depletion forming unit 232 may be separately arranged in parallel. At least one bridge connecting the first depletion forming unit 231 and the second depletion forming unit 232 may be formed. The at least one bridge may include, for example, a first bridge 241 and a second bridge 242. The first bridge 241 and the second bridge 242 may be in the form of a strip, and may be separated from each other. For example, the first bridge 241 and the second bridge 242 may be separately arranged in parallel.

At least one bridge connecting the second depletion forming unit 232 and the source electrode 251 may be formed. The at least one bridge may include, for example, a third bridge 243 and a fourth bridge 244. The third bridge 243 and the fourth bridge 244 may be in the form of a strip and may be separately separated from each other. For example, the third bridge 243 and the fourth bridge 244 may be arranged in parallel. However, the number, shape, and arrangement of bridges are not limited thereto, and any modification of the bridges may be possible as long as the bridges connect depletion forming units or connect a depletion forming unit and a source electrode.

A first contact portion 243a extending from the third bridge 243 under the source electrode 251 may be formed, and a second contact portion 244a extending from the fourth bridge 244 under the source electrode 251 may be formed. A contact portion may be formed for each bridge connected to a source electrode. Alternatively, when a plurality of bridges are connected to a source electrode, a contact portion may be selectively formed for each of the bridges. Also, a plurality of contact portions respectively formed for a plurality of bridges may be separated from one another. However, example embodiments are not limited thereto, and a plurality of contact portions that are formed for a plurality of bridges may also be connected to one another.

A first gate electrode 221 may be formed on the first depletion forming unit 231. The first gate electrode 221 may be disposed closer to the source electrode 251 than to the drain electrode 252. However, this is a non-limiting example, and a position of the first gate electrode 221 may be modified in various manners.

A second gate electrode 222 may be formed on the second depletion forming unit 232 between the source electrode 251 and the first gate electrode 221. The second gate electrode 222 may be separated from the first gate electrode 221 by a desired (and/or alternatively predetermined) distance. The second gate electrode 222 may include the same material as the first gate electrode 221. However, the second gate electrode 222 is not limited thereto. The second gate electrode 222 may not be included on the second depletion forming unit 232. That is, the second gate electrode 222 may be selectively included. The source electrode 251 and the second gate electrode 222 and the second gate electrode 222 and the first gate electrode 221 may be respectively electrically connected to each other via the first and second depletion forming units 231 and 232 or via the first to fourth bridges 241 to 244.

According to an example embodiment, the second gate electrode 222 is a floating electrode in which a second gate voltage is induced according to a first gate voltage applied to the first gate electrode 221. A lower voltage than a voltage applied to the first gate electrode 221 may be induced in the second gate electrode 222. A second gate voltage induced in the second electrode 222 may be determined according to the first gate voltage applied to the first gate electrode 221, an interval between the first gate electrode 221 and the second gate electrode 222, and an interval between the source electrode 251 and the second gate electrode 222. The second gate electrode 222, which is a floating electrode, performs the function of increasing a threshold voltage of the HEMT 200, and a threshold voltage of the HEMT 200 may be determined according to the second gate voltage induced in the second gate electrode 222.

Figure 14A:
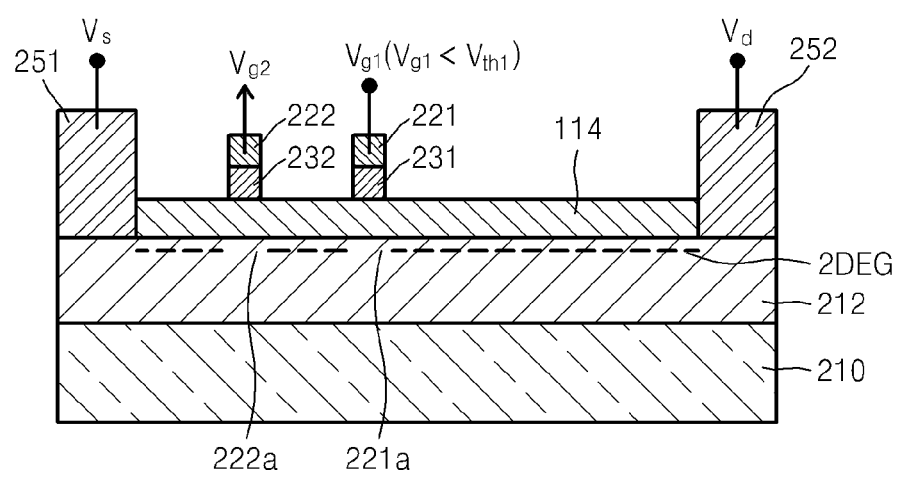
FIGS. 14A through 14C are schematic views for explaining an operation of the HEMT of FIG. 10, according to an example embodiment.
Figure 14B:
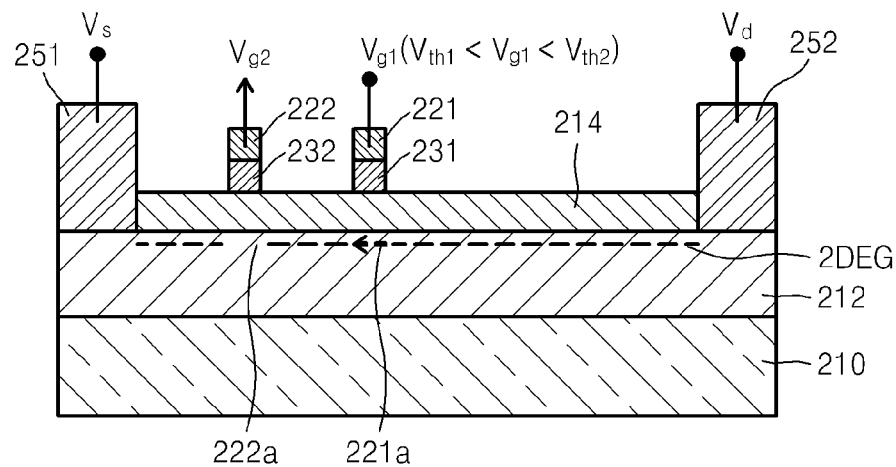
Figure 14C:
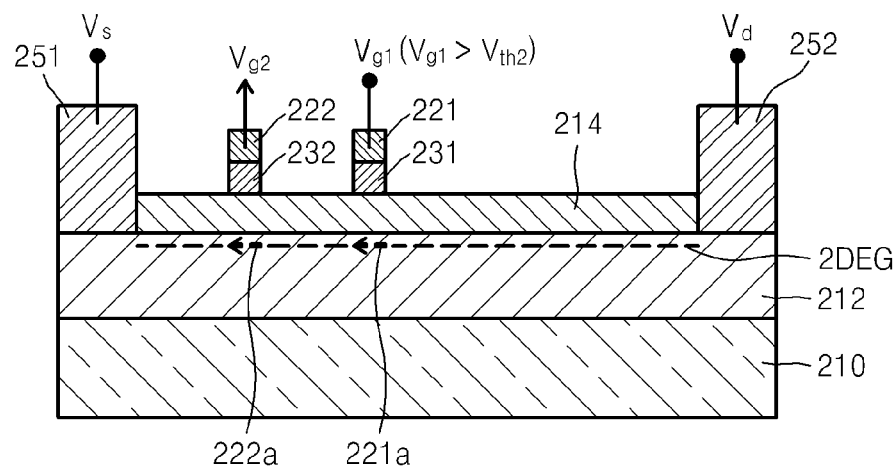

FIGS. 14A through 14C are schematic views for explaining an operation of the HEMT 200 of FIG. 10, according to an example embodiment. Here, a desired (and/or alternatively predetermined) source voltage $V_s$ and a desired (and/or alternatively predetermined) drain voltage $V_d$ may be respectively applied to the source electrode 251 and the drain electrode 252. When a first gate voltage $V_{g1}$ is applied to the first gate electrode 221, an interval between the first gate electrode 221 and the second gate electrode 222 is $L_{fg}$, and an interval between the source electrode 251 and the second gate electrode 222 is $L_{sf}$, a second gate voltage $V_{g2}$ induced in the second gate electrode 222 may approximately be $V_{g1} \times L_{sf}/(L_{fg}+L_{sf})$. The second gate voltage $V_{g2}$ may be adjusted by varying positions of the first gate electrode 221 and/or the second gate electrode 222.

FIG. 14A illustrates a case where the first gate voltage $V_{g1}$ applied to the first gate electrode 221 is smaller than the first threshold voltage $V_{th1}$. The first threshold voltage $V_{th1}$ refers to a minimum voltage needed to set channels (and/or configure channels) under the first and second gate electrodes 221 and 222 in an on state. Referring to FIG. 14A, when the first gate voltage $V_{g1}$ applied to the first gate electrode 221 is smaller than the first threshold voltage $V_{th1}$, the second gate voltage $V_{g2}$ induced in the second gate electrode is also smaller than the first threshold voltage $V_{th1}$. Accordingly, a first channel 221a formed under the first gate electrode 221 and a second channel 222a formed under the second gate electrode 222 are both in an off state.

FIG. 14B illustrates a case where the first gate voltage $V_{g1}$ applied to the first gate electrode 221 is greater than the first threshold voltage $V_{th1}$ but smaller than a second threshold voltage $V_{th2}$ ($V_{th1} < V_{g1} < V_{th2}$). The second threshold voltage $V_{th2}$ is $V_{th1} \times (L_{fg}+L_{sf})/L_{sf}$. Referring to FIG. 14B, when the first gate voltage $V_{g1}$ applied to the first gate electrode 221 is greater than the first threshold voltage $V_{th1}$. and is smaller than the second threshold voltage $V_{th2}$, the second gate voltage $V_{g2}$ induced in the second gate electrode 222 is smaller than the first threshold voltage $V_{th1}$. Accordingly, the first channel 221a formed under the first gate electrode 221 is in an on state but the second channel 222a formed under the second gate electrode 222 is in an off state.

FIG. 14C illustrates a case where the first gate voltage $V_{g1}$ applied to the first gate electrode 221 is greater than the second threshold voltage $V_{th2}$. Referring to FIG. 14C, when the first gate voltage $V_{g1}$ applied to the first gate electrode 221 is greater than the second threshold voltage $V_{th2}$, the second gate voltage $V_{g2}$ induced in the second gate electrode 222 is greater than the first threshold voltage $V_{th1}$. Accordingly, the first channel 221a formed under the first gate electrode 221 and the second channel 222a formed under the second gate electrode 222 are both in an on state, and as a result, a current flows through the channel layer 212 of the HEMT 200.

As described above, the HEMT 200 according to an example embodiment may have normally-off characteristics. Also, the HEMT 200 may include the second gate electrode 222, which is a floating electrode, between the source electrode 251 and the first gate electrode 221, and a threshold voltage $V_{th}$ of the HEMT 200 may be increased from the first threshold voltage $V_{th1}$ to the second threshold voltage $V_{th2}$. In addition, the threshold voltage $V_{th}$ of the HEMT 200 may be adjusted by varying positions of the first gate electrode 221 and/or the second gate electrode 222.

Also, although a single second gate electrode 222 is formed between the source electrode 251 and the first gate electrode 221 as described above, a plurality of second gate electrodes 222 may also be formed between the source electrode 251 and the first gate electrode 221.

Figure 15:
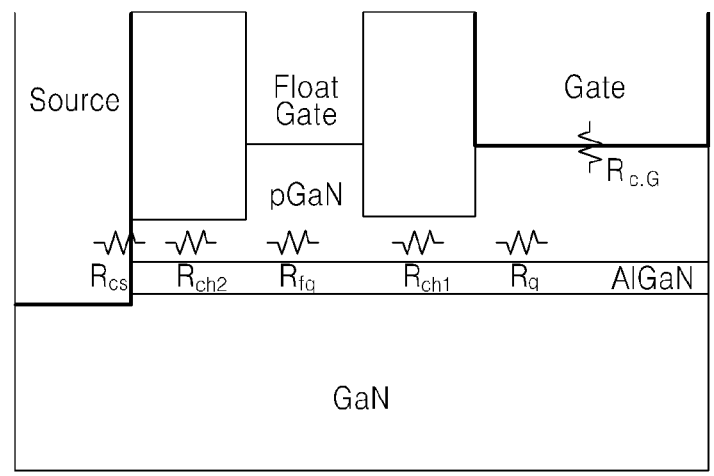
FIG. 15 is a graph that schematically illustrates a relationship between a voltage and resistance of a HEMT having a double gate structure, according to an example embodiment.

Next, FIG. 15 is a graph schematically showing contact resistance between a depletion forming unit and a source electrode of a HEMT having a double gate structure including first and second gate electrodes without a contact portion, according to an example embodiment.

A first gate voltage Vg between a first gate electrode and a source electrode may be represented by Formula 1 below:

$$V_g = i \cdot (R_{c,G} + R_g + R_{Ch1} + R_{fg} + R_{Ch2} + R_{c,S}) \quad \text{<Formula 1>}$$

Here, i denotes a current, $R_{c,G}$ denotes a contact resistance of the first gate electrode, Rg denotes a first channel resistance under a first gate, Rch1 denotes a second channel resistance between the first gate electrode and a second gate electrode, Rfg denotes a third channel resistance under the second gate electrode, Rch2 denotes a fourth channel resistance between the second gate electrode and the source electrode, and $R_{c,S}$ denotes a resistance of the source electrode.

A voltage Vfg between the second gate electrode and the source electrode may approximately be as defined by Formula 2:

$$V_{fg} \cong i \cdot (R_{fg}/2 + R_{Ch2} + R_{c,S}) \quad \text{<Formula 2>}$$

Here, (Rfg/2) denotes that the third channel resistance under the second gate electrode contributes to about ½ with respect to the voltage between the second gate electrode and the source electrode.

Next, a dispersion ($\Delta V_{fg}$) of the voltage Vfg is as follows:

$$\Delta V_{fg} \propto \Delta R_{fg}/2 + \Delta R_{Ch2} + \Delta R_{c,S} \quad \text{<Formula 3>}$$

$$\Delta R_{Ch2} = f(t_{bridge}^{-1}) \quad \text{<Formula 4>}$$

$$\Delta R_{c,S} = f(A_{Source/bridge}^{-1}) \quad \text{<Formula 5>}$$

The dispersion ($\Delta V_{fg}$) of the voltage Vfg may be generated by dispersions of Rch2 and $R_{c,G}$R. The dispersion of Rch2 is a value that is inversely proportional to a bridge thickness, and dispersion according to contact resistance is inversely proportional to a source electrode and a bridge surface area.

According to the above formulae, $R_{ch2}$ and $R_{c,S}$ may be the main reason of dispersion of a threshold voltage. Accordingly, by increasing a surface area of the bridge between the second gate electrode and the source electrode and a surface area of the contact portion under the source electrode, dispersion of a threshold voltage may be reduced.

Figure 16:
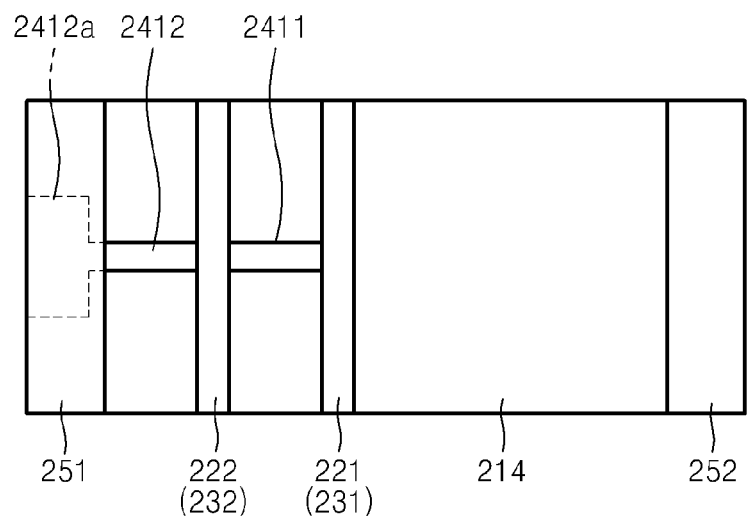
FIGS. 16 through 18 illustrate modified examples of patterns of a bridge and a contact portion of the HEMT illustrated in FIG. 10, according to some example embodiments.
Figure 17:
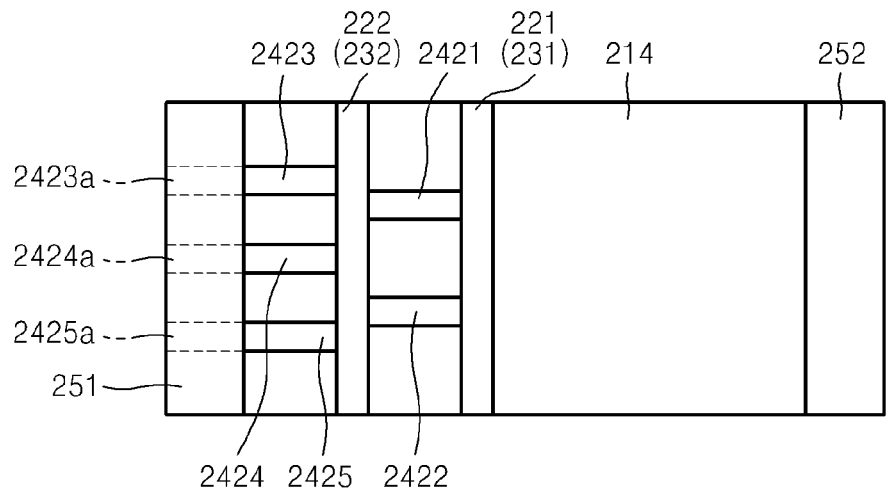
Figure 18:
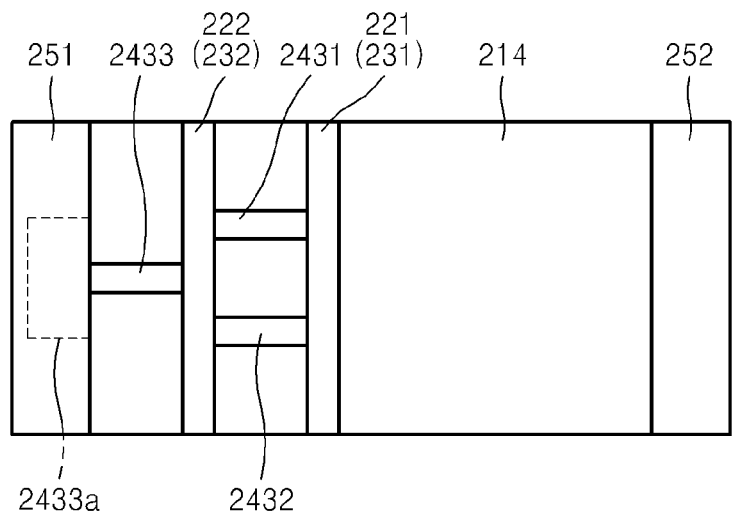

FIGS. 16 through 18 illustrate modified examples of patterns of at least one bridge and at least one contact portion of the HEMT 200 illustrated in FIG. 10, according to other some example embodiments. Referring to FIG. 16, a first bridge 2411 is formed between the first depletion forming unit 231 and the second depletion forming unit 232, and a second bridge 2412 is formed between the second depletion forming unit 232 and the source electrode 251. Also, a contact portion 2412a extending from the second bridge 2412 under the source electrode 251 may be formed. The contact portion 2412a may have a greater width than the second bridge 2412.

Referring to FIG. 17, first and second bridges 2421 and 2422 may be formed between the first depletion forming unit 231 and the second depletion forming unit 232, and third to fifth bridges 2423 to 2425 may be formed between the second depletion forming unit 232 and the source electrode 251. Also, a first contact portion 2423a, a second contact portion 2424a, and a third contact portion 2425a respectively extending from the third, fourth, and fifth bridges 2423, 2424, and 2425 under the second electrode 251 may be formed.

Referring to FIG. 18, first and second bridges 2431 and 2432 may be formed between the first depletion forming unit 231 and the second depletion forming unit 232, and a third bridge 2433 may be formed between the second depletion forming unit 232 and the source electrode 251. Also, a contact portion 2433a extending from the third bridge 2433 under the source electrode 251 may be formed. The contact portion 2433a may extend to a side edge of the source electrode 251 or to an inner portion of the source electrode 251. As described above, a depletion forming unit, a bridge, and a contact portion may be formed in various patterns.

Figure 19:
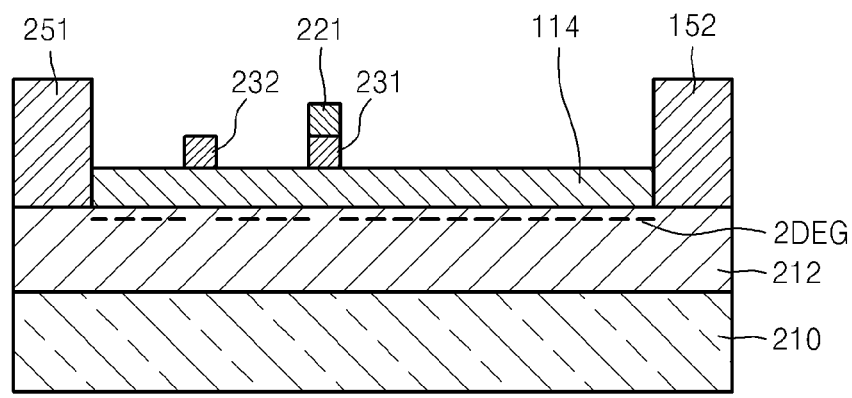
FIG. 19 illustrates the HEMT of FIG. 12 from which a second gate electrode is removed.

FIG. 19 illustrates the HEMT of FIG. 12 from which the second gate electrode 222 is removed. As illustrated in FIG. 19, the second gate electrode 222 may not be formed on the second depletion forming unit 232. For example, while providing the structures as illustrated in FIGS. 16 through 18, a HEMT may also be formed without the second gate electrode 222. Alternatively, although not illustrated in the drawings, a contact resistance unit (not shown) may be further formed under or inside the source electrode 251 in the HEMTs illustrated in FIGS. 16 through 18 (see FIG. 6).

FIGS. 20 through 28 illustrate a method of manufacturing a HEMT, according to an example embodiment.

Figure 20:
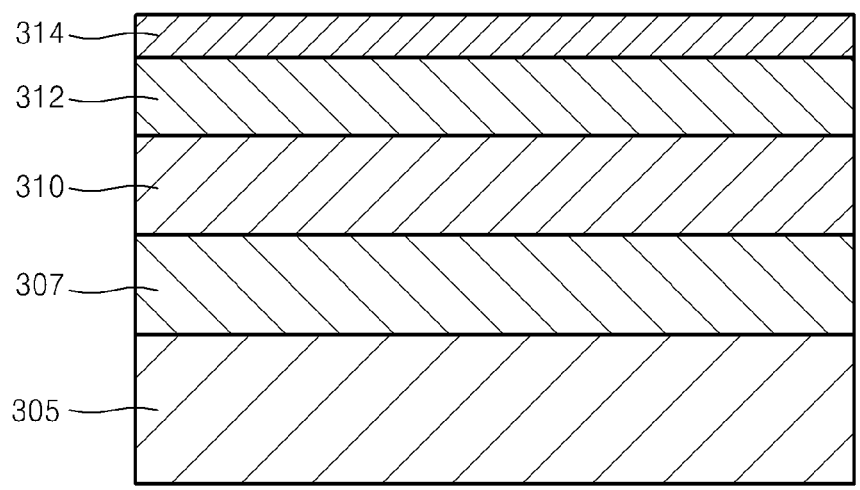
FIGS. 20 through 28 illustrate a method of manufacturing a HEMT according to an example embodiment.

As illustrated in FIG. 20, a substrate 305, a channel layer 310, and a channel supply layer 312 are stacked. A buffer layer 307 may be further included between the substrate 305 and the channel layer 310.

The substrate 305 may include, for example, sapphire, Si, SiC, or GaN. The channel layer 310 may be formed of a III-V compound semiconductor material, but it is not limited thereto. For example, the channel layer 310 may be formed as a GaN-based material layer. For example, the channel layer 310 may be formed as an undoped GaN layer, an undoped InGaN layer, or an undoped AlGaN layer. The channel supply layer 312 may include, for example, a nitride including at least one of Al, Ga, and In, and may have a single layer structure or a multi-layer structure. For example, the channel supply layer 312 may be an AlN layer, an AlGaN layer, an AlInN layer, an AlGaInN layer, or a combination of these. The substrate 305, the buffer layer 307, the channel layer 310, and the channel supply layer 312 may be substantially the same as the corresponding elements described above.

A first layer 314 for a depletion unit may be stacked on the channel supply layer 312. The first layer 314 may include, for example, a p-type semiconductor material. The first layer 314 may include a III-V nitride semiconductor. For example, the first layer 314 may include at least one of GaN, AlGaN, InN, AlInN, InGaN, and AlInGaN, and may be doped with a p-type impurity, such as Mg. For example, the first layer 314 may be a p-GaN layer or a p-AlGaN layer. A passivation layer (not shown) may be further formed between the channel supply layer 312 and the first layer 314 for a depletion unit.

Figure 21:
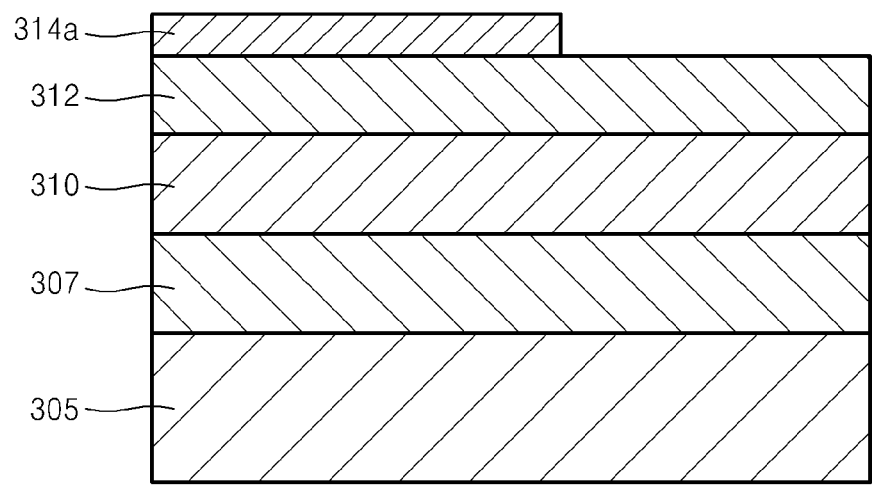
Figure 22:
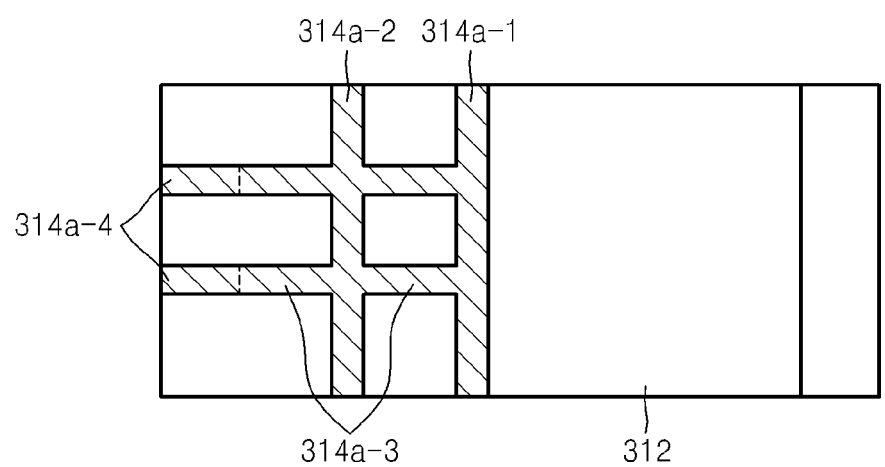

As illustrated in FIG. 21, a depletion unit 314a may be formed by patterning and etching the first layer 314. The depletion unit 314a may include at least one depletion forming unit, at least one bridge, and at least one contact portion as illustrated in FIG. 22. The at least one depletion forming unit may include, for example, a first depletion forming unit 314a-1 and a second depletion forming unit 314a-2, and the at least one bridge may include a first bridge and a second bridge 314a-3 that connect the first depletion forming unit 314a-1 and the second depletion forming unit 314a-2, and third and fourth bridges 314a-3 formed at a side of the second depletion forming unit 314a-2. Also, a contact portion 314a-4 extending from each of the third and fourth bridges may be formed.

Figure 23:
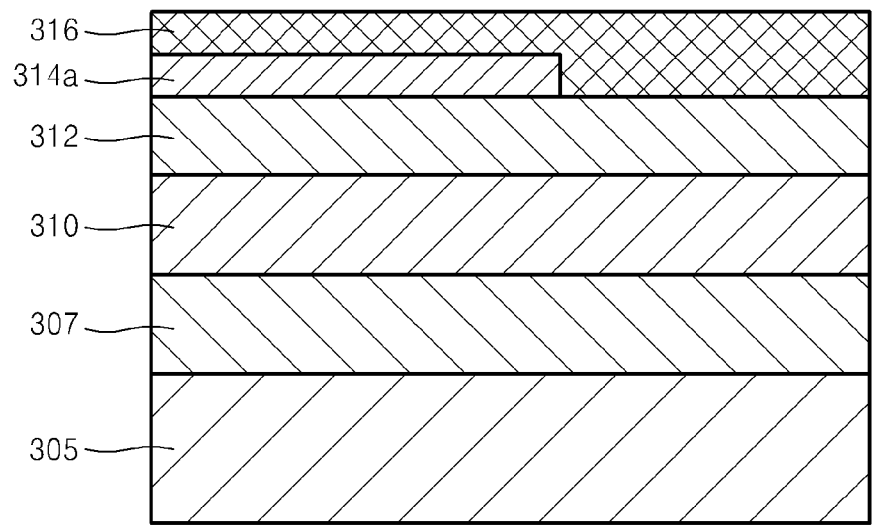

Referring to FIG. 23, a second layer 316 is stacked to cover the depletion unit 314a and the exposed channel supply layer 312. The second layer 316 may be formed of various metals or metal compounds. For example, the second layer 316 may be formed of at least one material selected from the group consisting of W, Ta, TaN, TiN, Ti, Al, Ti/Al, Hf, and the like. Also, as illustrated in FIG. 24, the second layer 316 may be patterned according to the pattern of the at least one of depletion forming units 321 and 322 and etched so as to form a first gate electrode 321 and a second gate electrode 322.

Figure 24:
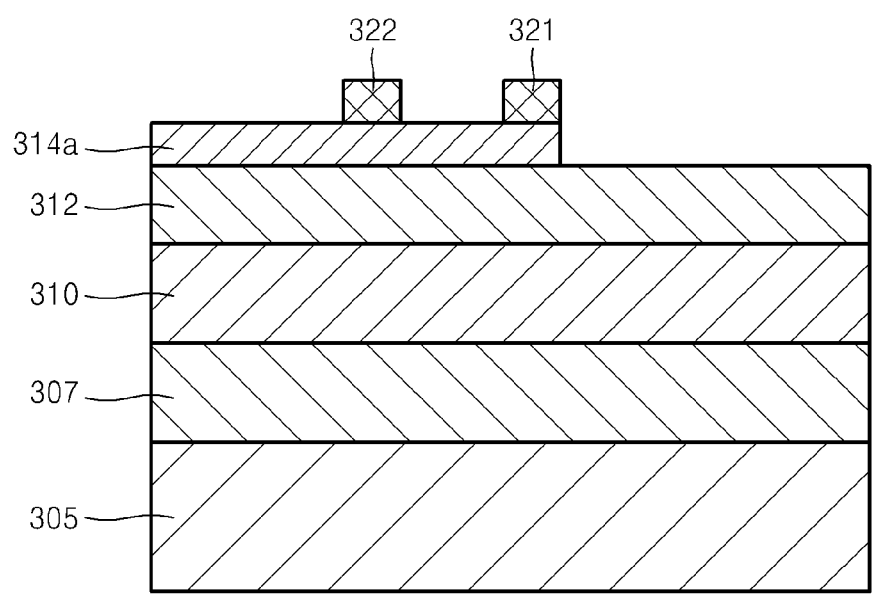
Figure 25:
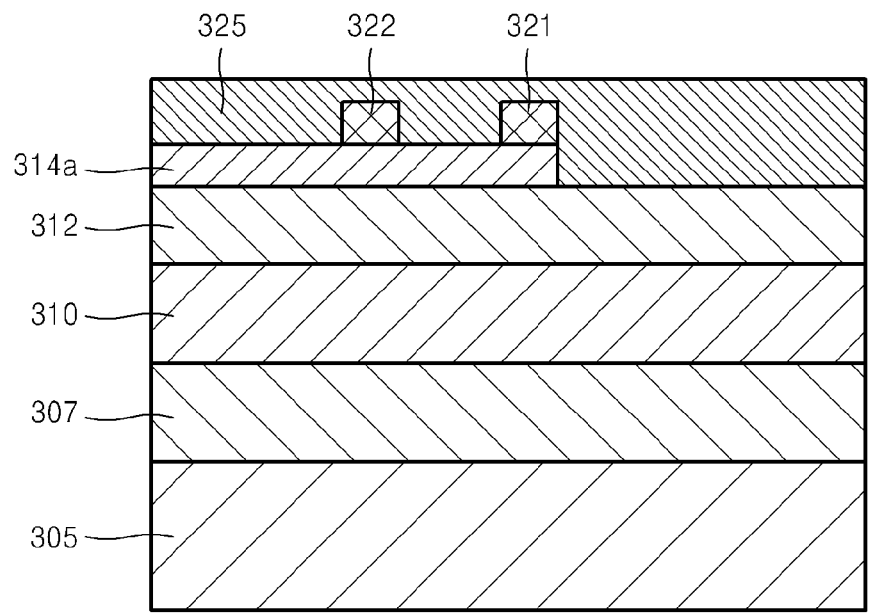
Figure 26:
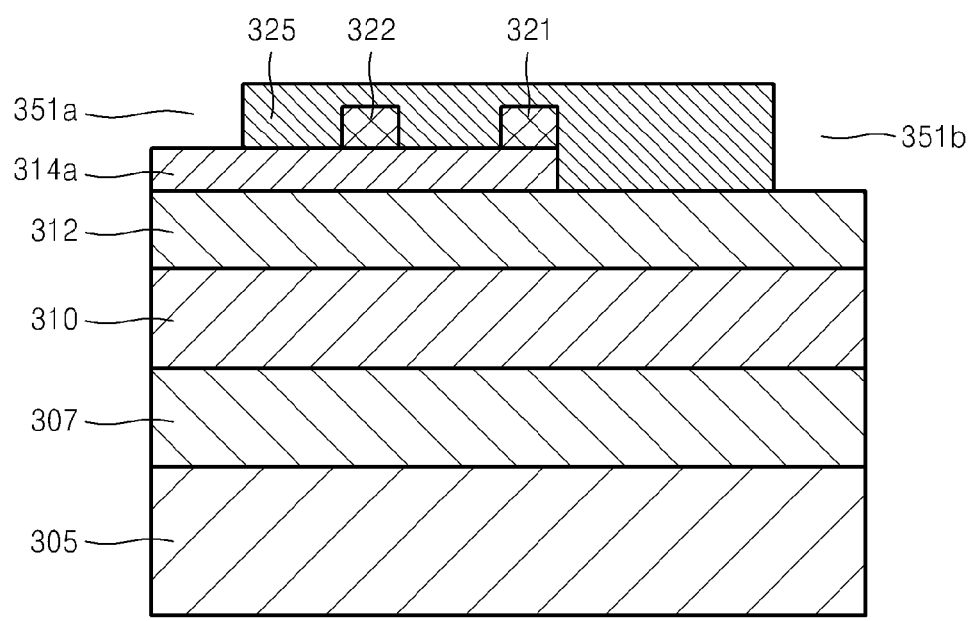
Figure 27:
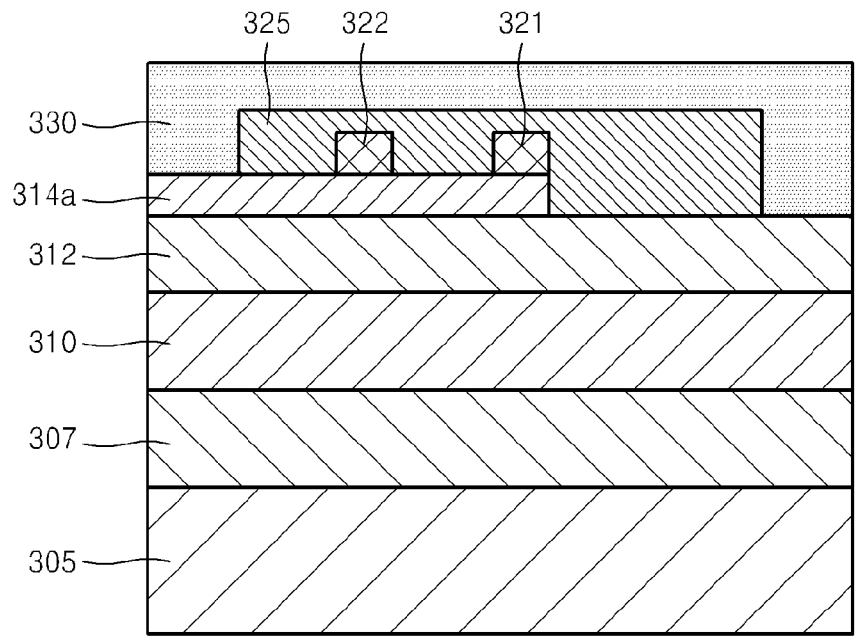
Figure 28:
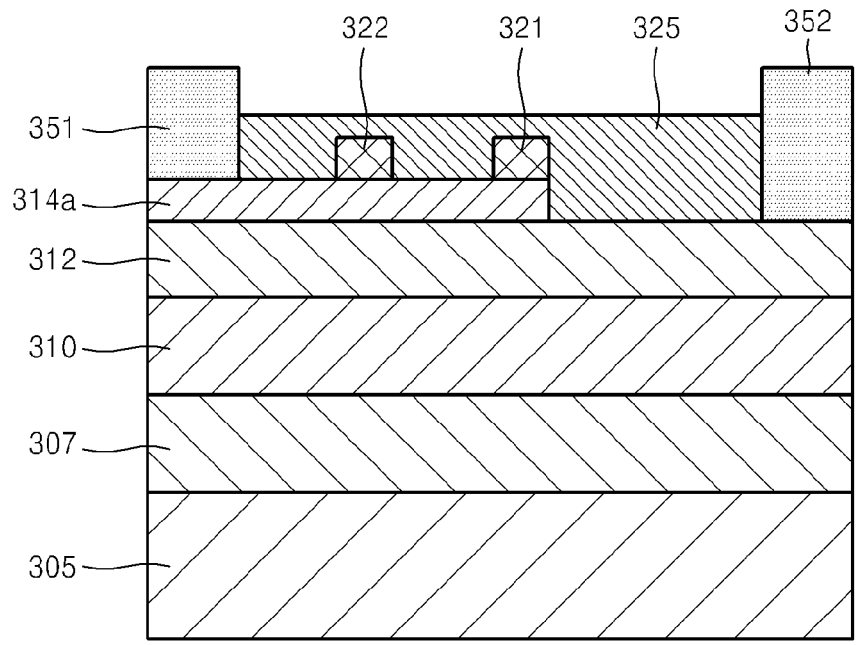

Then, as illustrated in FIG. 25, a third layer 325 is stacked on a structure illustrated in FIG. 24. The third layer 325 may be formed of a nitride or an oxide. The third layer 325 may be used as a passivation layer to electrically separate a source electrode and a drain electrode from each other, which are to be formed later. Referring to FIG. 26, the third layer 325 is etched to form a source area 351a and a drain area 352a. Next, as illustrated in FIG. 27, a fourth layer 330 is stacked on the third layer 325. The fourth layer 330 may be formed of the same material as the second layer 316 but it is not limited thereto. Referring to FIG. 28, the fourth layer 330 may be patterned and etched to form a source electrode 351 and a drain electrode 352. The source electrode 351 may be formed to cover the contact portion 314a. The source electrode 351 and the drain electrode 352 may be formed to contact the channel supply layer 312. However, the source electrode 351 and the drain electrode 352 are not limited thereto, and a source electrode and a drain electrode may be formed by etching two sides of the channel supply layer 312 until the channel layer 310 is exposed or by further performing an operation of etching the channel supply layer 312 only up to a desired (and/or alternatively predetermined) depth thereof such that the channel layer 310 is not exposed, thereby adjusting positions of lower surfaces of the source electrode 351 and the drain electrode 352. At least a portion of the lower surface of the source electrode 351 or at least a portion of a lower concave surface of the source electrode 351 may electrically contact the contact portion 314a.

As described above, according to one or more example embodiments, by increasing a contact surface area with respect to the source electrode by using a bridge and a contact portion, the dispersion of a threshold voltage may be reduced.

It should be understood that the example embodiments described herein should be considered in a descriptive sense only and not for purposes of limitation. Descriptions of features or aspects within each HEMT according to an example embodiment should typically be considered as available for other similar features or aspects in other HEMTs according to other example embodiments.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
a channel supply layer on a channel layer,
the channel layer including a first semiconductor material;
the channel supply layer including a second semiconductor material, and
the channel supply layer configured to generate a two-dimensional electron gas (2DEG) in the channel layer;
a source electrode and a drain electrode separated from each other and connected to the channel supply layer;
a depletion forming unit on the channel supply layer, the depletion forming unit configured to form a depletion region in the 2DEG;
a gate electrode on the depletion forming unit;
a bridge that connects the source electrode to the depletion forming unit; and
a contact portion that extends from the bridge to under or into the source electrode,
wherein the depletion forming unit is located to be separated from each of the source electrode and drain electrode.

2. The HEMT of claim 1, wherein a width of the contact portion is the same as or different than a width of the bridge.

3. HEMT of claim 1, comprising:
a plurality of depletion forming units on the channel supply layer, the plurality of depletion forming units including a first depletion forming unit and a second depletion forming unit that are separated from each other; and
a plurality of gate electrodes, the plurality of gate electrodes including a first gate electrode on the first depletion forming unit and a second gate electrode on the second depletion forming unit.

4. The HEMT of claim 3, comprising:
a plurality of bridges on the channel supplying layer, the plurality of bridges including a first bridge, a second bridge, and a third bridge;
a plurality of contact portions, the plurality of contact portions including a first contact portion and a second contact portion, wherein
the second contact portion and the second bridge are the contact portion and the bridge of the contact portion that extends from the bridge to under the source electrode,
the third bridge connects the first depletion forming unit to the second depletion forming unit,
the first bridge connects the second depletion forming unit to the source electrode, and
the first contact portion extends from the first bridge to under the source electrode.

5. The HEMT of claim 3, wherein
the second gate electrode is a floating electrode, and
the first gate electrode, if a first gate voltage is applied to the first gate electrode, is configured to induce a second gate voltage in the second gate electrode.

6. The HEMT of claim 3, wherein a second gate voltage induced in the second gate electrode is determined by a first gate voltage applied to the first gate electrode, an interval between the first gate electrode and the second gate electrode, and another interval between the second gate electrode and the source electrode.

7. The HEMT of claim 1, further comprising:
a thin film between the source electrode and the contact portion.

8. The HEMT of claim 1, wherein the first semiconductor material is a GaN-based material.

9. The HEMT of claim 1, wherein the second semiconductor material comprises a nitride including at least one of Al, Ga, and In.

10. The HEMT of claim 1, wherein the second semiconductor material is doped with an n-type material.

11. The HEMT of claim 1, further comprising:
a buffer layer, wherein
the buffer layer comprises at least one of a GaN layer, an AlGaN layer, an AlN layer, and an InN layer, and
the channel layer is on the buffer layer.

12. The HEMT of claim 1, wherein the depletion forming unit comprises a p-type semiconductor material.

13. The HEMT of claim 12, wherein the depletion forming unit comprises a III-V nitride semiconductor material.

14. The HEMT of claim 1, wherein a single body includes the depletion forming unit, the bridge, and the contact portion.

15. The HEMT of claim 1, further comprising:
a passivation layer on the channel supply layer.

16. The HEMT of claim 1, wherein the bridge is not provided between the depletion forming unit and the drain electrode.

17. A high electron mobility transistor (HEMT) comprising:
a channel supply layer on a channel layer,
the channel layer including a first semiconductor material;
the channel supply layer including a second semiconductor material, and
the channel supply layer configured to generate a two-dimensional electron gas (2DEG) in the channel layer;
a source electrode and a drain electrode separated from each other and connected to the channel supply layer;
a depletion forming unit on the channel supply layer, the depletion forming unit configured to form a depletion region in the 2DEG;
a gate electrode on the depletion forming unit;
a bridge that connects the source electrode to the depletion forming unit;
a contact portion that extends from the bridge to under or into the source electrode;
a plurality of bridges that connect the source electrode to the depletion forming unit, the plurality of bridges including a first bridge and a second bridge between the depletion forming unit and the source electrode;
a plurality of contact portions that extend from the bridge to under or into the source electrode, the plurality of contact portions including a first contact portion and a second portion, wherein
the first contact portion extends from an end portion of the first bridge to under the source electrode,
the second contact portion extends from an end portion of the second bridge to under the source electrode, and
the first contact portion and the first bridge are the contact portion and the bridge of the contact portion that extends from the bridge to under the source electrode.

* * * * *